United States Patent
Patapoutian et al.

(10) Patent No.: US 7,752,531 B2
(45) Date of Patent: Jul. 6, 2010

(54) DEFECT SENSING VITERBI BASED DETECTOR

(75) Inventors: Ara Patapoutian, Hopkinton, MA (US); Rose Y. Shao, Worcester, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 414 days.

(21) Appl. No.: 11/854,214

(22) Filed: Sep. 12, 2007

(65) Prior Publication Data

US 2009/0070658 A1    Mar. 12, 2009

(51) Int. Cl.
*H03M 13/03* (2006.01)
(52) U.S. Cl. ............... 714/795; 714/792; 714/794; 714/796; 375/262; 375/341
(58) Field of Classification Search ............ 714/792, 714/794–796; 375/265, 341
See application file for complete search history.

(56) References Cited

U.S. PATENT DOCUMENTS

| | | | | |
|---|---|---|---|---|
| 5,081,651 A | * | 1/1992 | Kubo | 375/341 |
| 5,537,444 A | * | 7/1996 | Nill et al. | 375/341 |
| 5,548,600 A | * | 8/1996 | Fredrickson et al. | 714/792 |
| 5,586,128 A | * | 12/1996 | Chen | 714/792 |
| 6,446,236 B1 | | 9/2002 | McEwen et al. | |
| 6,507,927 B1 | | 1/2003 | Kalliojarvi | |
| 6,532,122 B1 | * | 3/2003 | Sugawara et al. | 360/46 |
| 6,567,489 B1 | * | 5/2003 | Glover | 375/376 |
| 7,031,090 B2 | * | 4/2006 | Ichihara et al. | 360/65 |
| 7,111,225 B2 | * | 9/2006 | Coene et al. | 714/792 |
| 7,237,173 B2 | | 6/2007 | Morita et al. | |
| 7,263,652 B2 | * | 8/2007 | Zaboronski et al. | 714/794 |
| 7,549,106 B2 | * | 6/2009 | Maiuzzo | 714/755 |

* cited by examiner

*Primary Examiner*—Esaw T Abraham
(74) *Attorney, Agent, or Firm*—Christopher J. Volkmann; Westman, Champlin & Kelly, P.A.

(57) ABSTRACT

A detector includes a Viterbi based detector and an erasure detector that detects as erasures one or more bits associated with a decoding window in which survivor paths do not merge within the decoding window.

21 Claims, 4 Drawing Sheets

DEFECT SENSING VITERBI BASED DETECTOR

BACKGROUND

The invention relates generally to detectors and, more particularly, to Viterbi based detectors.

Viterbi based detectors, that is, Viterbi hard decision detectors or soft output Viterbi algorithm ("SOVA") detectors, are well known and are used alone or in conjunction with iterative decoders, such as low density parity check ("LDPC") decoders, to reproduce data bits or symbols from a signal that represents stored or transmitted data. The Viterbi based detector operates in accordance with a decoding trellis that models the encoding of the data and the channel through which the data signal travels to the detector as a finite state model. The Viterbi based detector essentially determines survivor paths to respective states of the decoding trellis based on associated branch metrics. A given survivor path corresponds to the lowest "cost" or path metric associated with the paths leading to the state.

The Viterbi based detector of interest assigns a value to an associated bit or a symbol based on a selected survivor path through a "decoding window," which has a length that is associated with the memory length of the channel. The detectors may be used with ISI channels, convolutional codes, and so forth. The decoding window, also referred to as a "decision delay," includes a predetermined number of bit positions (or bit times), and is represented by a corresponding number of state transitions on the trellis paths. Thus, the Viterbi based detector assigns a value to a data bit or a data symbol at the start of the decoding window based on the tracing back of a selected survivor path through the decoding window.

After the values are assigned to the bits or symbols, they are passed through other decoding circuitry, such as a demodulator, to produce the corresponding user data.

The Viterbi based detector may use one of several well-known methods to assign the bit or symbol values. One method selects an arbitrary survivor path, for example, the surviving path that ends at state zero, and assigns the value at the start of the path. Another common method is a majority vote technique, in which the starting value that is associated with the majority of the survivor paths is selected. A third is to use the value associated with the best survivor path, that is, the path that is associated with the minimum cost metric. These selection methods work well and, generally, result in the assigning of the same bit values when the data signal meets the overall assumptions of the model. One such assumption is that white Gaussian noise is typical for data signals read from a magnetic storage medium.

One problem with the Viterbi detector, however, is that the detector assigns values to the data signal regardless of whether or not the signal matches the model assumptions. If, for example, the assumption of white Gaussian noise in the data signal is violated because of a defect in the recording media, the Viterbi detector may produce a bit pattern that is invalid. Such a bit pattern is then passed on through the decoding circuitry and may ultimately be presented to a user as valid data. The use of LDPC decoders in conjunction with the Viterbi decoder may compound the problem, since reliability values assigned to the invalid data are utilized in the iterative decoding operations.

SUMMARY OF THE INVENTION

During decoding using a Viterbi based detector, erasures are detected when surviving paths do not merge in an associated decoding window.

A detector comprising a Viterbi based detector and an erasure detector detects as erasures one or more bits associated with a decoding window in which survivor paths do not merge.

A method of decoding comprises determining survivor paths through a portion of a decoding trellis that corresponds to a decoding window, determining if the survivor paths merge within the decoding window and if so, making a decision for a corresponding bit or symbol, and if not, determining that one or more bits or symbols associated with the decoding window are erasures and setting one or more erasure flags for the one or more bits or symbols.

A system comprises a soft output Viterbi based detector, an erasure detector that detects as erasures one or more bits associated with a decoding window in which survivor paths do not merge and an iterative decoder that decodes data based on bit values and soft information provided by the Viterbi detector with the soft information for the erasures set to a predetermined minimum value.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
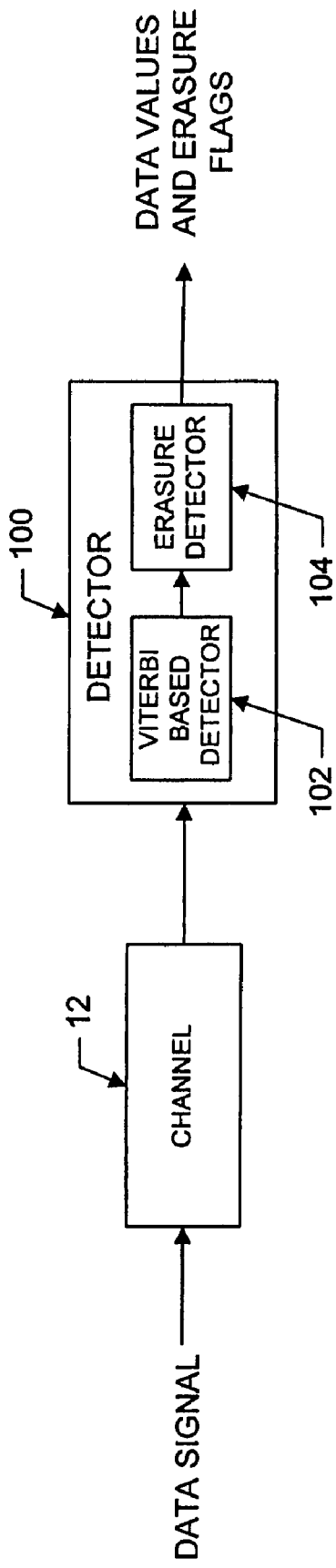
FIG. 1 is a functional block diagram of a system constructed in accordance with the invention.

Referring to FIG. 1, a channel 12 operates in a known manner to provide to a detector 100 a data signal that corresponds, for example, to information read from a magnetic disk (not shown). The detector 100 operates in accordance with a decoding trellis 200 (FIG. 2), which corresponds to the encoding and transmission of the data, to assign bit or symbol values to the data signal.

The detector 100 includes a Viterbi based detector 102 and an erasure detector 104. The Viterbi based detector 102 may be configured to assign values to data bits or symbols. In the example, the Viterbi based detector assigns values to data bits. We first discuss the operation of the system with the Viterbi based detector making a hard decision by assigning a bit value to the data signal based on surviving paths in an associated decoding window. Thereafter, we discuss the operation of the system with the Viterbi based detector also producing a soft output or reliability value for the bit, that is, with the Viterbi based detector operating in accordance with a soft output Viterbi algorithm or as a "SOVA detector."

Figure 2:
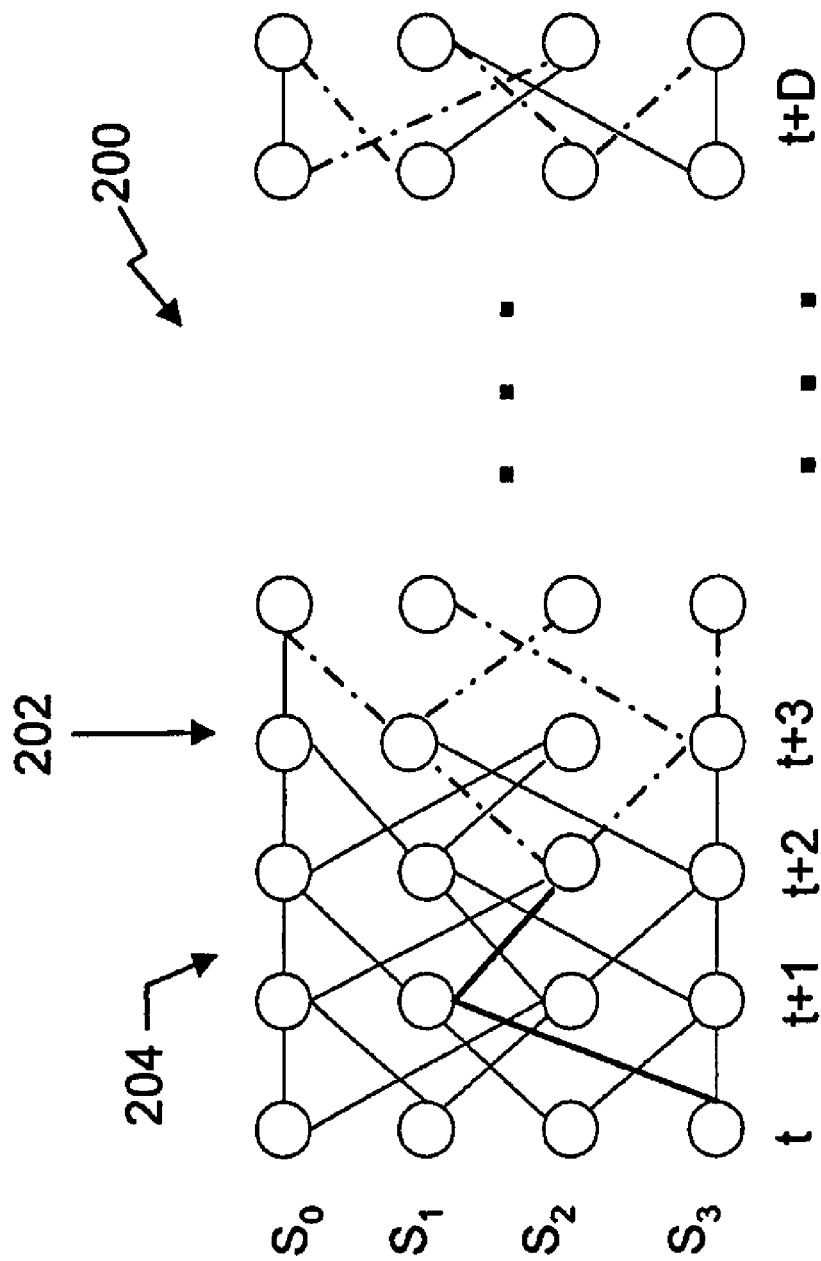
FIG. 2 is a diagram of a portion of a decoding trellis that corresponds to a decoding window.

The Viterbi based detector 102 operates in a known recursive manner to determine surviving paths through decoding windows that are associated, in the example, with hard decisions for data bits at different times. A decoding window consists of D-bit positions (or bit times) and corresponds to the portion of the decoding trellis 200 depicted in FIG. 2. The Viterbi based detector determines surviving paths to the respective states $S_1$-$S_j$, referred to collectively as "states 202," over a decoding window from t to t+D, based on the branch metrics associated with the path branches 204 of the trellis. After the surviving paths have been selected for states $S_1$-$S_j$ at position (or time) t+D, the erasure detector determines if the surviving paths have merged within the decoding window, that is, if the surviving paths at time t+D all trace back to the same state $S_1$ in at least the first position (time t) in the decoding window. If so, the Viterbi detector assigns to the first bit the value associated with the merged path and slides the decoding window over by one bit position to cover time t+1 to t+D+1. If, however, the erasure detector determines that the surviving paths do not merge, the erasure detector sets, or asserts, an erasure flag for the data bit that corresponds to the first position in the decoding window. In FIG. 2, the surviving paths merge at time t+2, and the merged trace back path is indicated by the bold line. The individual surviving trace back paths are indicated in the drawing by dotted lines.

For data processing operations that require high data reliability, the erasure detector 104 may set erasure flags for a predetermined number or all of the bit positions included in the decoding window in which the surviving paths do not merge. Thus, in the example, the erasure detector may set erasure flags also for bit positions t+1 through t+D−1. The erasure detector may also set erasure flags for a predetermined numbers of bits before and/or after the decoding window, to provide even greater data reliability. In this way, the system overcomes the adverse effects of a media defect on signals at the boundary of the defect, as well as false convergence due to residual defect signals.

Figure 3:
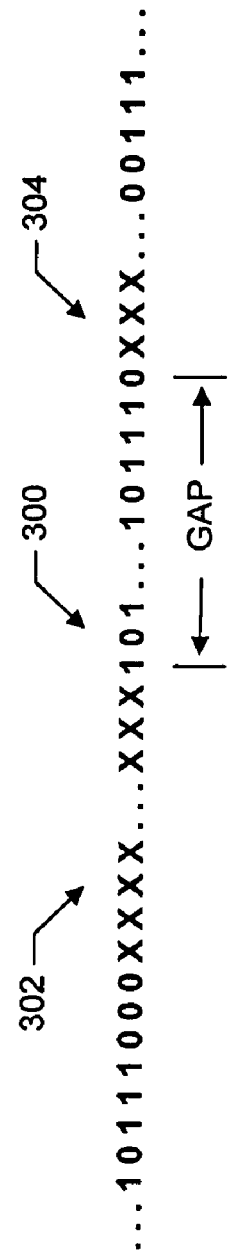
FIG. 3 is an illustration of detected erasures and an intermediate gap.

Alternatively, or in addition, the erasure detector may set erasure flags (indicated by "Xs" in FIG. 3) for bits that fall within a gap 300 of "m" or fewer bits between two detected erasures 302, 304. For example, the erasure detector may set erasure flags for m=20 bits that are between two detected erasures, such that the system treats the two detected erasures and the gap as one long erasure, for more powerful error correction.

The erasure detector may instead set the erasure flag if some subset of the survivor paths do not merge. For example, the erasure detector may set the erasure flag if the two best paths, i.e., the path with the lowest metric and the path with the next lowest metric, do not merge within the decoding window. This simplifies the operations of the erasure detector, and such a system still detects a large majority of the invalid bit value assignments, particularly those associated with media defects.

The detector may also operate in a time varying manner, and assign values to a predetermined number of consecutive bits in the decoding window in which the paths merge. In FIG. 2, for example, the system may assign values to bit positions t and t+1. The next paths traced back through a decoding window will then correspond to the next bit time for which a value has not been assigned, that is, the system slides the decoding window an appropriate number of bit positions or times, in the example, two bit positions, to correspond to the number of bits that have been assigned bit values.

The bit values and erasure flags are provided to error correction circuitry, such as a Reed Solomon decoder, which operates in a known manner to correct the flagged erasures and any detected errors in the bit values, and produce the user data.

Figure 4:
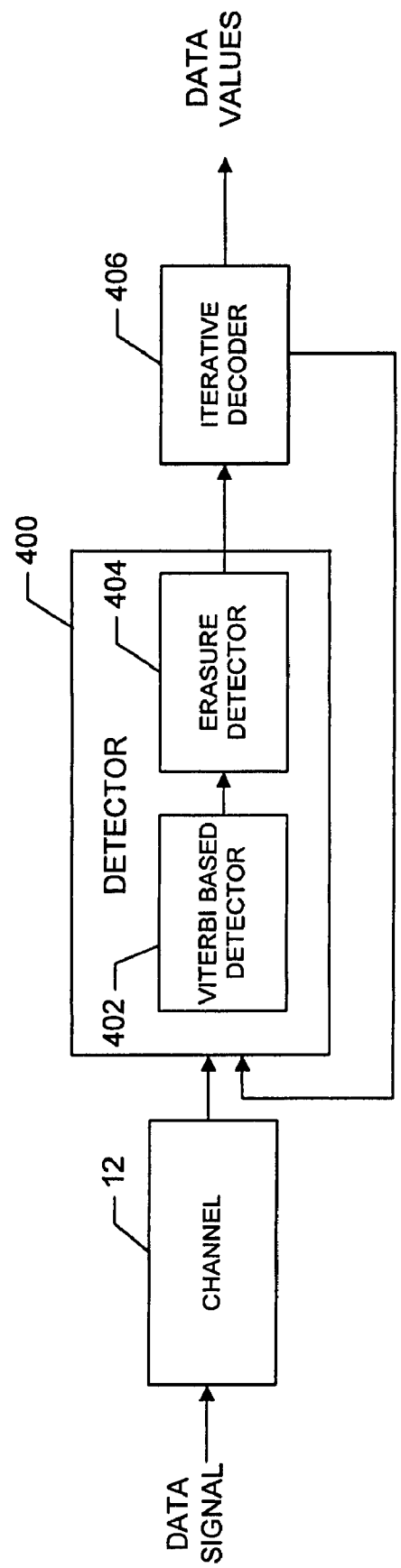
FIG. 4 is functional block diagram of an alternative system constructed in accordance with the invention.

Referring now to FIG. 4, we discuss an example in which soft values, or reliability information, is used during the decoding operations. The Viterbi based detector 402 operates in a known manner in accordance with a soft output Viterbi algorithm ("SOVA") to assign both bit values and reliability information to the data signal. The Viterbi based detector thus utilizes branch metrics and associated apriori values to assign path (reliability) metrics to the paths through the decoding window. The detector selects as the surviving path to a given state the path that is associated with the least cost.

The erasure detector 404 next determines if the surviving paths through the decoding window all merge in the decoding window. If so, the erasure detector passes the bit value and the associated reliability information associated with bit time t to an iterative decoder 406. If the paths do not merge, the erasure detector in one example sets the reliability information for the bit to a predetermined lowest cost, in the example, all-zeros, to label the bit as an erasure. The erasure detector then passes the bit and the all-zero reliability information to the iterative decoder, which in the example is a low density parity check ("LDPC") decoder.

After all of the data in a data block are assigned bit values and reliability information, the iterative decoder 406 operates in a known manner to decode the data and, as appropriate, correct the erasures. After an appropriate number of iterations, the decoder determines if the data have been successfully decoded, that is, if the decoded data meet overall reliability criteria. If so, the iterative decoder provides the decoded data to follow-on decoding circuitry, such as a demodulator (not shown).

If the decoded data do not meet the reliability criteria, that is, do not converge, the decoder 406 sends updated apriori information to the Viterbi based detector 402, and the detector then utilizes the updated information in a known manner to produce updated bit values and reliability information. The erasure detector 404 may again determine if the updated surviving paths in the respective decoding windows merge and set the corresponding reliability information to zeros or not, as appropriate. Alternatively, the erasure detector may use the erasure information from the first pass through the Viterbi based detector to set the reliability information for the erasure bits to all-zeros, since the physical locations of the erasures do not change.

The updated bit values and reliability information are returned to the iterative decoder and the decoder again performs its iterative decoding operations. After a predetermined number of iterations, the decoder 406 tests if the data are reliably decoded or if another end condition has been met, for example, if a maximum number of updating operations involving the Viterbi based detector have been performed. The iterative decoder then either ends the decoding operation or returns the updated apriori information to the Viterbi detector for a next updating operation, as appropriate. At the end of the decoding operations, the iterative decoder provides reliably decoded data to follow-on decoding circuitry. If, however, the data are not reliably decoded, the iterative decoder provides the data values and erasure information to error recovery operations.

In systems that require greater reliability, the erasure detector 404 may, in addition to determining if the surviving paths merge, determine if the reliability information for the merging survivor paths match for the starting bit/symbol positions in the decoding window. If the paths merge but the reliability information does not match, the erasure detector determines that an erasure has occurred and sets the reliability information for the associated bit or bits to zeros or predetermined minimum values. Alternatively, the erasure detector determines if the reliability information for two or more selected paths match, and if not sets the reliability information for the associated bit or bits to zeros or predetermined minimum values.

Figure 5:
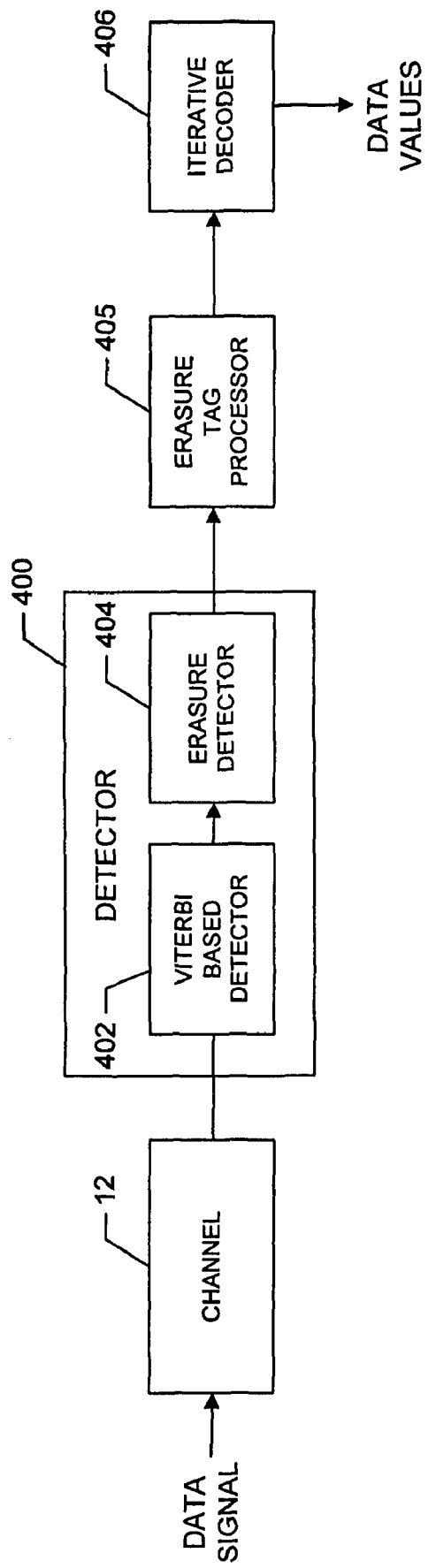
FIG. 5 is a functional block diagram of an alternative arrangement of the system of FIG. 4.

In an alternative arrangement, as depicted in FIG. 5, an erasure tag processor 405 maintains an erasure tag vector that includes, for example, 0s for the erasure locations and 1s otherwise. The erasure tag processor sets the reliability information for the erasure positions to all zeros or predetermined minimum values in the data block based on the vector, before the data and reliability information are supplied to and/or utilized by the iterative decoder 406. The erasure tag processor may buffer the data values and reliability information while the Viterbi detector is processing the data block and provide to the iterative decoder the bit values and processed reliability information for the entire block. Alternatively, the iterative decoder may buffer the bit values and reliability information and the erasure tag processor may then manipulate the buffered data to alter the reliability information based on the erasure tag vector before the iterative decoder performs its iterative decoding operations. As discussed, the erasure tag vector may be generated in each update operation or the update operations may proceed with erasure tag vector obtained in the first pass of detection.

The Viterbi based detector 102 and 402 nay be symbol-level detectors; with branch metrics and apriori values that correspond to the possible symbols. The symbol-level detectors operate in known manners to assign values and, as appropriate, reliability information, to the data signal. The erasure detector flags erasure locations as discussed above, with each location corresponding to an erroneous symbol.

The system described above operates on-the-fly to produce erasure location information for use in iterative and error correction decoders, which also operate on-the-fly. When error recovery operations are required, the system also provides the erasure location information to the error recovery decoders.

The foregoing description has been directed to specific embodiments. It will be apparent, however, that other variations and modifications may be made to the described embodiments, with the attainment of some or all of their advantages. For example, the iterative decoder may decode the data in accordance with a block code, convolutional code, turbo code or other iterative code, error correction coding schemes and other implementations that utilize decoding windows, the processors depicted separately may be combined or a processor depicted individually may consist of several processors, and erasures may be flagged, have their reliability set to predetermined low values, or both. Accordingly, this description is to be taken only by way of example and not to otherwise limit the scope of the invention. Therefore, it is the object of the appended claims to cover all such variations and modifications as come within the true spirit and scope of the invention.

What is claimed is:

1. A detector comprising:
   a Viterbi based detector configured to utilize a decoding trellis to assign values to bits associated with a data signal, wherein the Viterbi based detector determines a plurality of survivor paths to respective states of the decoding trellis in a decoding window representing a number of bits, wherein the Viterbi based detector assigns a value to one or more bits associated with the decoding window if survivor paths merge within the decoding window; and
   an erasure detector that identifies one or more bits associated with the decoding window as erasures if survivor paths do not merge within the decoding window.

2. The detector of claim 1 wherein the erasure detector sets one or more erasure flags for the one or more bits.

3. The detector of claim 2 wherein the erasure detector includes in the erasure a predetermined number of bits in the decoding window.

4. The detector of claim 3 wherein the erasure detector includes in the erasure a predetermined number of bits before the decoding window, after the decoding window, or both.

5. The detector of claim 1 wherein the one or more bits are data symbols.

6. The detector of claim 1 wherein the erasure detector detects an erasure if at least one of the survivor paths does not merge.

7. The detector of claim 1 wherein the erasure detector detects an erasure if a predetermined number of the survivor paths do not merge.

8. The detector of claim 1 wherein the Viterbi based detector is a soft output detector and the erasure detector further detects erasures if the soft information for the respective survivor paths does not match.

9. A computer-implemented method of decoding comprising:
   determining a plurality of survivor paths through a portion of a decoding trellis that corresponds to a decoding window, the plurality of survivor paths representing paths to respective states in the portion of the decoding trellis;
   determining, using a processor of a computer, if the plurality of survivor paths merge within the decoding window such that the survivor paths trace back to a same state in the decoding window;
   if the survivor paths merge within the decoding window, assigning a value to one or more bits corresponding to the decoding window based on the merged survivor paths; and
   if the survivor paths do not merge within the decoding window, assigning an erasure to one or more bits corresponding to the decoding window.

10. The method of claim 9 wherein the step of assigning includes including in the erasure a predetermined number of bits in the decoding window.

11. The method of claim 9 wherein the step of assigning includes including in the erasure a predetermined number of bits preceding the decoding window, following the decoding window or both.

12. The method of claim 9 wherein the decoding trellis includes associated soft values and the step of determining erasures further includes determining an erasure when the soft output values associated with the survivor paths do not match.

13. The method of claim 9 wherein the step of determining if the survivor paths merge includes determining if at least one of the survivor paths does not merge.

14. The method of claim 9 wherein the step of determining if the survivor paths merge includes determining if a predetermined number of the survivor paths merge.

15. A system comprising:
   a soft output Viterbi based detector configured to utilize a decoding trellis to assign values to bits associated with a data signal, wherein the Viterbi based detector determines a plurality of survivor paths to respective states of the decoding trellis in a decoding window representing a number of bits, wherein the Viterbi based detector assigns a value to one or more bits associated with the decoding window if survivor paths merge within the decoding window;

an erasure detector that identifies one or more bits associated with the decoding window as erasures when survivor paths do not merge within the decoding window; and an iterative decoder that decodes data based on bit values and soft information produced by the Viterbi based detector with the soft information for the erasures set to a predetermined minimum value.

16. The system of claim 15 wherein the erasure detector includes in the erasure a predetermined number of bits in the decoding window.

17. The system of claim 16 wherein the erasure detector further includes in the erasure a predetermined number of bits preceding the decoding window, following the decoding window or both.

18. The system of claim 15 wherein the one or more bits are data symbols.

19. The system of claim 15 wherein the erasure detector detects an erasure if at least one of survivor paths does not merge.

20. The system of claim 15 wherein the erasure detector detects an erasure if a predetermined number of the survivor paths do not merge.

21. The system of claim 15 wherein the erasure detector further detects erasures if the soft information produced by the Viterbi based detector for the survivor paths does not match.

* * * * *